United States Patent [19]
Gorter

[11] 4,142,218
[45] Feb. 27, 1979

[54] MAGNETORESISTIVE HEAD
[75] Inventor: Frederik W. Gorter, Eindhoven, Netherlands
[73] Assignee: U.S. Philips Corporation, New York, N.Y.
[21] Appl. No.: 677,054
[22] Filed: Apr. 14, 1976
[30] Foreign Application Priority Data
Apr. 14, 1975 [NL] Netherlands ............... 7504396
Apr. 15, 1975 [NL] Netherlands ............... 7504442
[51] Int. Cl.² .................. G11B 5/30; H01C 7/16
[52] U.S. Cl. ........................ 360/113; 324/252; 338/32 R
[58] Field of Search ............ 360/113, 122, 125; 324/46; 338/32 R; 340/174 EB

[56] References Cited
U.S. PATENT DOCUMENTS

| | | | |
|---|---|---|---|
| 3,716,781 | 2/1973 | Almasi et al. | 340/174 EB |
| 3,879,760 | 4/1976 | Lazzari | 360/113 |
| 3,945,038 | 3/1976 | Lazzari | 360/113 |
| 3,947,889 | 3/1976 | Lazzari | 360/113 |
| 4,040,113 | 8/1977 | Gorter | 360/113 |
| 4,052,748 | 10/1977 | Kuijk | 360/113 |

FOREIGN PATENT DOCUMENTS 2512525  3/1975  Fed. Rep. of Germany ........... 360/113

Primary Examiner—Alfred H. Eddleman
Attorney, Agent, or Firm—David R. Treacy; Robert S. Smith

[57] ABSTRACT

A magnetic reading device having two electrically series-arranged magnetoresistive elements, in particular for interference compensation and positioning control. A pattern of equipotential strips is provided on each element to adjust the quiescent angle α between the direction of magnetisation and the direction of current passage of one element between 30° and 60° and between 210° and 240°, respectively, and that of the other element at 360° − α and 180° − α, respectively, the device has for various applications an automatic compensation of the signals across the elements so that the use of difference amplifiers is superfluous. In addition, due to this adjustment, the reproduction characteristics has a linear variation.

8 Claims, 7 Drawing Figures

MAGNETORESISTIVE HEAD

The invention relates to a magnetic reading device for detecting information-representing magnetic fields on a magnetic recording medium, comprising a number of flat magnetoresistive elements each having an in-plane easy axis of magnetisation and each comprising at their ends electric contacts via which the elements are connected to an electric circuit for detecting their resistance variations.

In IBM Technical Disclosure Bulletin, vol. 14, No. 8, January 1972, pp. 2488-9 a device is described the operation of which is based on the use of strip-shaped elements of a ferromagnetic, metallic material, for example Ni-Fe, provided on a non-magnetic substrate, which elements are connected in a bridge circuit and one of which is brought in the immediate proximity of, or in contact with, a magnetic recording medium with one of its edges. The field of the recording medium produces variations in the magnetisation of the latter element and modulates the resistance thereof via the magneto-resistance effect. This means that, when the recording medium passes the device, the information-representing magnetic fields present on the medium rotate the spin system of the magnetoresistive element so that the resistance varies. In this manner the output signal of the bridge circuit in which the element is incorporated assumes the form of voltage fluctuations which represent the information stored in the recording medium.

In order to compensate for the effect on the magnetoresistive element of external interference fields, at least one further magnetoresistive element is incorporated in the bridge circuit. This element does not "sense" the magnetic fields of the recording medium but does "sense" interfering external fields.

Scanning devices are also known in which two magnetoresistive elements, each having a length equal to half the track width, are arranged beside each other. By supplying their signals to a difference amplifier, an indication is obtained about the place of such a magnetoresistance combination above the track.

The two known devices require comparatively complicated electric circuits and/or magnetoresistive configurations to obtain the desired output signal.

In addition there is the difficulty that the variation of the resistance of a magnetoresistive element under the influence of a magnetic field is quadratic, so that it is desirable upon scanning analog recordings to optimize the operation of the element by linearizing the resistance characteristic. It is known to do this by applying a transverse magnetic bias field by means of external means to an elongate element the easy axis of magnetisation of which coincides with the longitudinal direction of the element. Under the influence of this field, the direction of magnetisation of the element which in the absence of an external field coincides with the easy axis of magnetisation is rotated through a certain angle. The strength of the bias field is preferably such that the direction of magnetisation encloses an angle of 45° with the direction of current passage through the element. The drawbacks of the use of the transversal magnetic bias field are that their is a danger that the information on the recording medium will be varied by it, and that it is difficult to adjust the strength of the field at the correct value to give all the magnetoresistive elements used the same bias.

It is an object of the invention to provide a magnetic scanning device which does not have the said drawbacks. For that purpose, the device according to the invention is characterized in that it comprises a first and a second magnetoresistive element having equally oriented directions of magnetisation, on each of which is provided a pattern of mutually parallel equipotential strips to adjust the quiescent angle $\alpha$ between the direction of magnetisation and the direction of current passage of the first element between 30° and 60° and the quiescent angle of the second element, at 360° $-$ $\alpha$, the elements being connected in series. With an adjustment of $\alpha$ between 210° and 240° the quiescent angle of the second element should be 180° $-$ $\alpha$.

The effect of the above-described configuration resides in the fact that, by providing a pattern of equipotential strips on an element, the current is forced to travel at a desired angle with the longitudinal direction so that the quiescent angle between the direction of magnetisation and the direction of current passage can easily be adjusted. In this manner it is particularly simple to cause the quiescent angles between the easy axis and the direction of current passage of two magnetoresistive elements connected in an electric circuit to differ such that the resistance variations of the elements under the influence of a magnetic field are of opposite sign. In other words, the compensation is in the configuration itself, so that the use of a difference amplifier as in the known magnetoresistance devices having interference compensation or positioning control, is not necessary. Moreover the desired adjustment is realised without it being necessary to apply a bias field which might vary the information on the recording medium.

A preferred embodiment of the device according to the invention is characterized in that a magnet is present for generating at the area of each element a magnetic auxiliary field the direction of which coincides with the direction of magnetisation of the element. As will be explained in detail hereinafter, such a longitudinal auxiliary field which preferably has a strength which is of the order of magnitude of the coercive field strength of the material of the magnetoresistive elements, enables the selection of one of the two possible stable states of the magnetisation. This makes it possible to series-produce scanning devices of the present type in a reproducible manner, it being practical when of each element the direction of magnetisation is parallel to its edge to be facing the recording medium.

In particular, the principle of the invention may be used advantageously in scanning devices having positioning control or interference compensation.

For that purpose, a first modified embodiment of the device according to the invention is characterized in that the magnetoresistive elements are of equal length and are positioned in line and have a combined length which corresponds to the width of information tracks present on a recording medium to be scanned, the elements being connected to a current source, a voltage being formed between the final contacts of the pair formed by the first and second element when the pair is not centred on a track to be followed, positioning means controlled by said voltage being present to continuously keep the pair of elements centred on a track to be followed.

For that purpose, a second modified embodiment of the device according to the invention is characterized in that the device comprises a substrate an edge of which is intended to cooperate with a recording medium to be scanned, the first and the second magnetoresistive element being provided at different distances from the said edge.

In the latter case it is also possible to compensate for crosstalk of the signals of tracks present beside a selected track when it is ensured that the distance to the edge of the substrate of the element farthest remote from the said edge is of the order of magnitude of the distance between two adjacent information tracks on a recording medium to be scanned.

The invention will be described in greater detail with reference to the drawing but is not restricted to what is shown therein.

Figure 1:
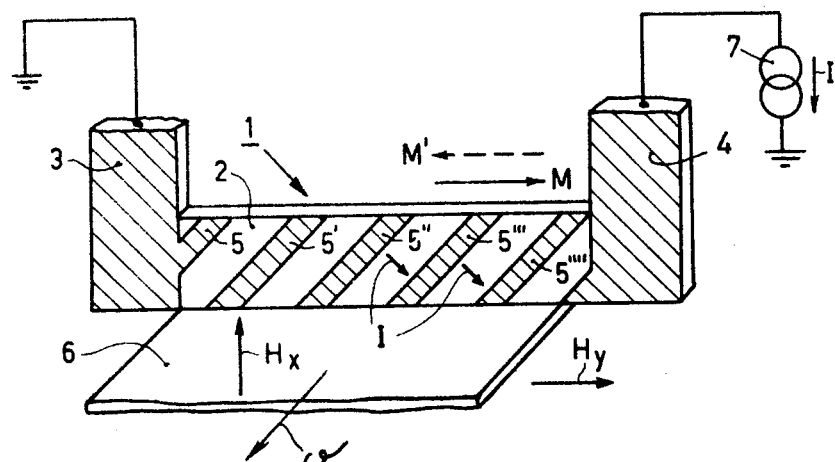
FIG. 1 shows a magnetoresistive element in which the quiescent angle between the direction of the easy axis of magnetisation and the direction of current passage is approximately 45°.
Figure 3:
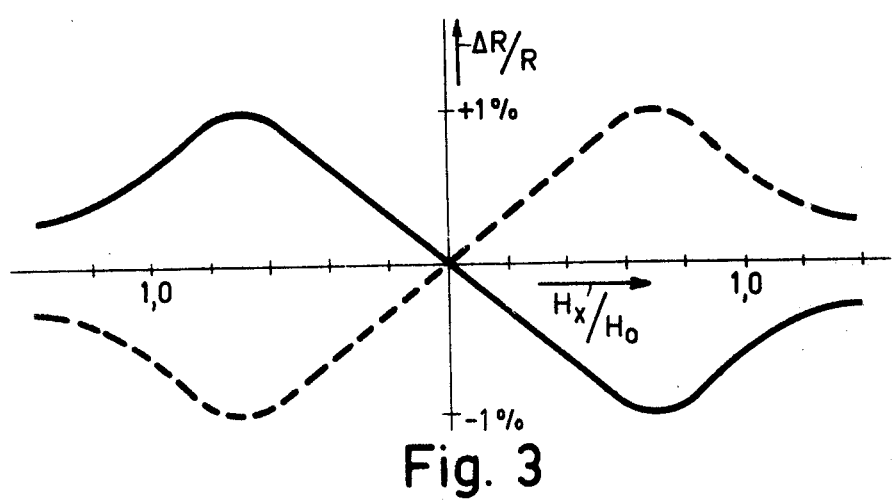
FIG. 3 is a graphic representation of the relationship between the relative resistance variation $\Delta R/R$ of the elements of FIGS. 1 and 2 and the strength of a standardized external magnetic field $H_x/H_o$.

FIG. 1 shows a magnetoresistive element 1 consisting of an NiFe film 2 having gold connections 3, 4 and covered with a pattern of stripes 5, 5', 5'', 5''', 5'''' of gold which extend at an angle of 135° with the direction of magnetisation M in the quiescent state. Under the influence of the — equipotential — stripes 5, 5', 5'', 5''', 5'''', the current I will travel at an angle of approximately 45° with (M.). It has been suggested to designate a magnetoresistive element having such a stripe pattern as a "Barber Pole". This name will be used hereinafter. The static resistance characteristic as is shown in FIG. 3 belongs to said configuration. Because the magnetisation in the NiFe may have two stable states (solid line (M) and broken line (M') in FIG. 1), there are in fact two static resistance characteristics (shown in FIG. 3 as a solid line and as a broken line), dependent on which of the two stable states is present. As is usual, it has been assumed that the NiFe film comprises only one magnetic domain.

One of the two stable states, for example M, can be selected by means of a longitudinal field $H_y$ having a strength of the magnitude of the coercive force of the NiFe (see FIG. 1).

In the stable state (of FIG. 1), in which the solid line arrow hence indicates the actual direction of magnetisation, a field $H_x$ which represents the information on the recording medium 6 will rotate the magnetisation in such manner that the angle between the magnetisation and the current I (maintained by a current source 7) increases; in that case the resistance decreases (see solid - line characteristic of FIG. 3).

Figure 2:
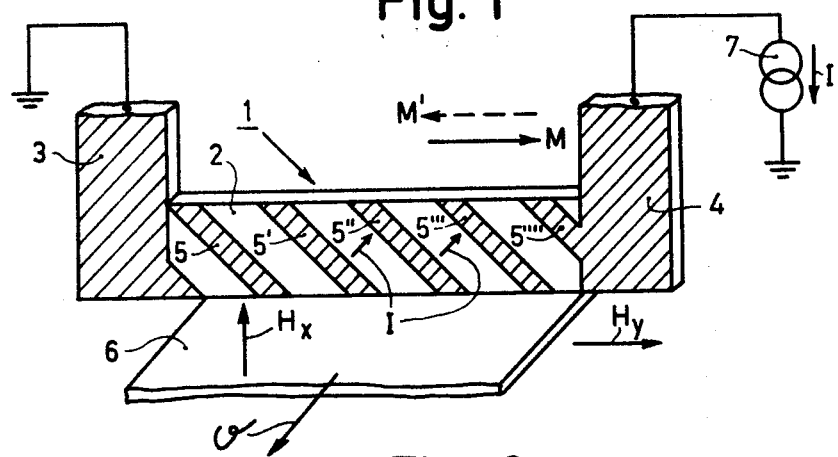
FIG. 2 shows a magnetoresistive element in which said quiescent angle is approximately −45°.

In FIG. 2, in which the same reference numerals are used for the same components as in FIG. 1, the situation is shown that the stripes 5, 5', 5'', 5''', 5'''', do not extend at an angle of 135°, but an angle of 45° with M. Upon rotation of the magnetisation under the influence of the field $H_x$, the angle between the current I and the direction of the magnetisation which in the quiescent state is −45° will decrease; the resistance increases. This is denoted by the broken line static characteristic of FIG. 3. FIG. 3 shows the relative resistance variation $\Delta R/R$, as a function of the strength of the normalized external field $H_x/H_o$. $H_o$ is a field which indicates at what field saturation occurs while assuming that the quadratic character of the resistance characteristic is maintained up to an angle of 90° between the direction of current passage and the direction of magnetisation. $H_o$ depends on the height and the thickness of the magnetoresistive element in question.

Hence two static resistance characteristics are possible which are replicas of each other relative to the $H_x/H_o$ axis as a result of the two stable states of the magnetisation.

If the stable state of the magnetisation is reversed while simultaneously reversing the direction of the gold stripes, then notching at all changes and the static characteristic remains the same. Hence, also two static characteristics which are replicas of each other with respect to the $H_x/H_o$ axis are found in case the direction of the stripes is reversed.

1. Interference Compensation

Figure 4:
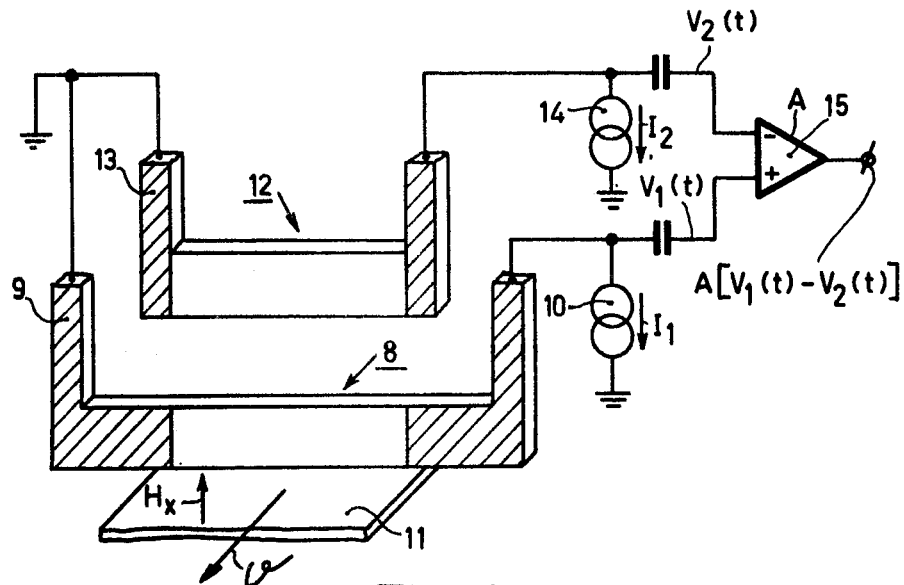
FIG. 4 shows a conventional magnetoresistance scanning device having interference compensation.

Interference compensation can be obtained in known manner with an extra magnetoresistive element 12 parallel to a scanning element 8 but arranged at a larger distance from the magnetic medium 11 (FIG. 4). The two magnetoresistive elements 8, 12 should be incorporated in a bridge circuit. Both are controlled with a current source 10 and 14, respectively; one side, 9 and 13, respectively, of the elements 8, 12 is connected to earth. The difference of the voltage across the elements is amplified in a difference amplifier 15.

Figure 5:
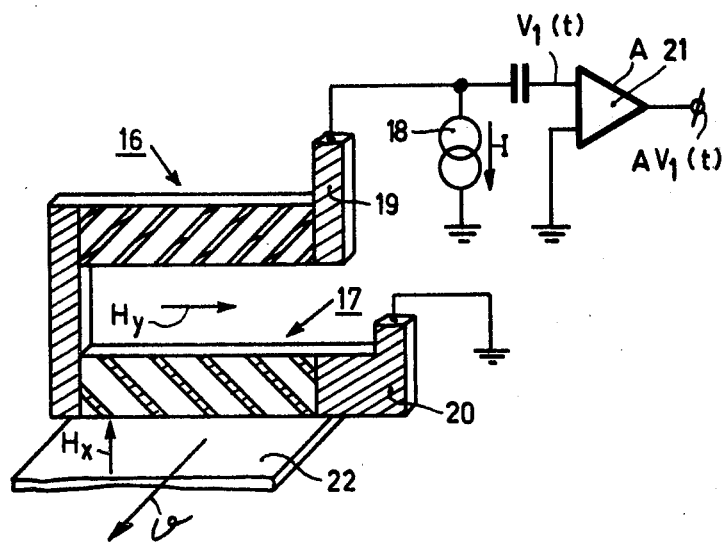
FIG. 5 shows a magnetoresistance scanning device having interference compensation according to the invention.

For linearising the reproduction characteristics and for automatic interference compensation, two Barber Poles are used within the scope of the invention the stripes of which are replicas of each other relative to an axis perpendicular to the recording medium 22 (see FIG. 5). Furthermore, a longitudinal field $H_y$ is applied which has the same direction for both. The two Barber poles 16, 17 are arranged in series and operated with one current source 18. If now, as a result of a magnetic interference field, the resistance of one of them increases, that of the other one decreases; so the overall resistance does not vary as a result of a magnetic interference field. The voltage between the final contacts 19, 20 of both elements is now supplied to a normal amplifier 21 instead of to a difference amplifier. So the compensation is already in the Barber poles due to the replicated characteristics. The field $H_x$ which represents the information on the recording medium 22 only influences the resistance of the element 17.

2. Centering on the Track

Figure 6:
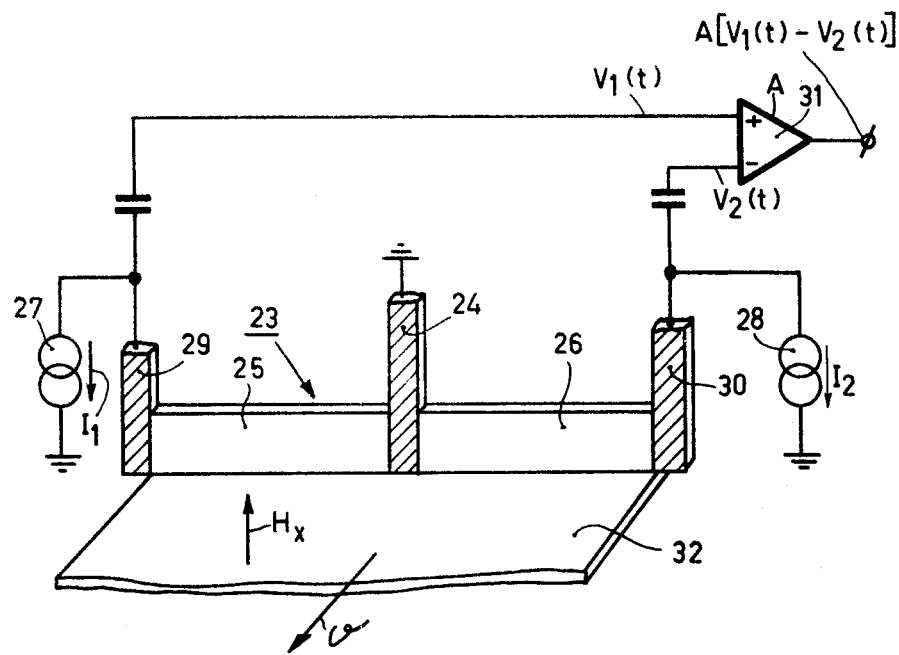
FIG. 6 shows a conventional magnetoresistance device having positioning control.

A track searching head as described in the published Dutch Patent Application No. 7,309,590 consists of two magnetoresistive elements which are positioned in line. This may also be considered as one magnetoresistive head 23 having a centre tapping 24 (FIG. 6). Said centre tapping 24 is connected to earth and both halves 25, 26 of the element 23 are controlled by means of current sources 27 and 28, respectively. The difference of the voltages between the contacts 24, 29 and 24, 28, respectively, is applied to a difference amplifier 31. When the head is centrally above a track on the recording medium 31, both halves 25, 26 supply the same amount of signal, so the difference signal then is equal to zero. When the head is partially above a track, one half will produce more signal than the other one.

Figure 7:
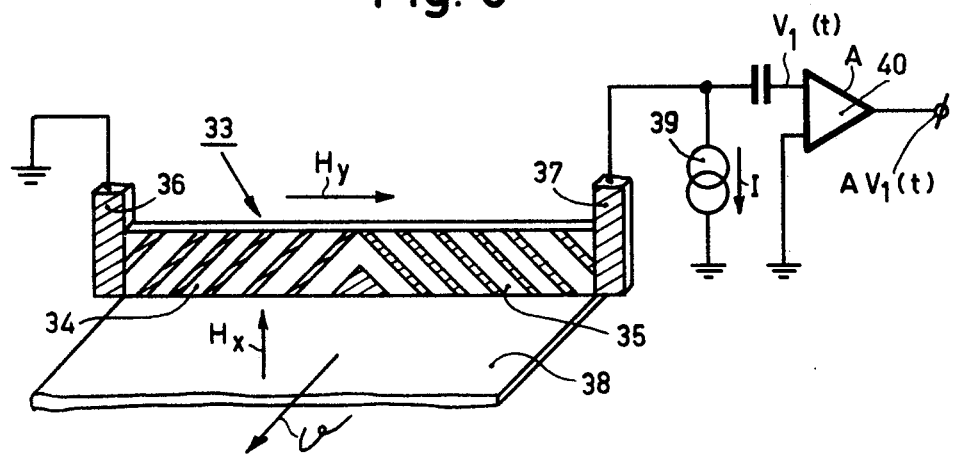
FIG. 7 shows a magnetoresistance device having positioning control according to the invention.

In this case also, within the scope of the invention, the elements may be constructed as replicated "Barber Poles", as is shown in FIG. 7. This figure shows a magnetoresistance configuration 33 which consists of two halves 34, 35 having stripe patterns which are replicas of each other relative to an axis normal to the medium. There is one longitudinal field $H_y$. The configuration according to the invention needs only two connections 36, 37. When the head is present centrally above a track on the recording medium 38, the resistance fluctuations in the two halves 34, 35 are opposite, so no output signal is generated. When the head is partially on a track, the resistance of one half varies more strongly than that of the other half (where said variation is opposite), so that a net resistance variation remains and the head generates an output signal. This signal may be used to control positioning means which keep the head centrally above the track. The assembly is operated by means of one current source 39 and the voltage across the final contacts 36, 37 is amplified with a normal amplifier 40.

The following is remarked with reference to the embodiments shown in the figures. The magnetoresistive elements are always shown in a position in which they extend normal to the plane of the recording media. However, they may also be arranged parallel to the plane of the recording media. See, for example, the article by R. P. Hunt entitled: "A magnetoresistive transducer" published in "IEEE Transactions on Magnetics", vol. mag. −7 No. 1, March 1971, pp. 150–154.

For the rest, the substrates on which the films are provided and possible further envelopes are not shown in the Figures for reasons of clarity.

I claim:

1. A magnetic reading device for detecting information-representing magnetic fields on an associated magnetic recording medium which comprises: a number of flat magnetoresistive elements each having an in-plane easy axis of magnetisation and each comprising at their ends electric contacts via which the elements are connected to an electric circuit for detecting their resistance variations, said elements including a first and a second magnetoresistive elements having equally oriented directions of magnetisation, on each of which is provided a pattern of mutually parallel equipotential strips to adjust the quiescent angle α between the direction of magnetization and the direction of current passage of the first element between 30° and 60° and the quiescent angle of the second element at 360° − α, the elements being connected in series.

2. A magnetic scanning device for detecting information-representing magnetic fields on a magnetic recording medium which comprises: a number of elongate magnetoresistive elements having an easy axis of magnetisation which are each provided at their ends with electric contacts via which the elements are connected in an electric circuit for detecting their resistance variations, said elements comprise a first and a second magnetoresistive elements having equally oriented directions of magnetisation and on each of which is provided a pattern of mutually parallel equipotential strips to adjust the quiescent angle α between the direction of magnetization and the direction of the current passage of the first element between 210° and 240° and the quiescent angle of the second element at 180° − α, the elements being connected electrically in series.

3. A device as claimed in claim 1 further including a magnet for generating at the area of each element a magnetic auxiliary field the direction of which coincides with the direction of magnetization of the element.

4. A device as claimed in claim 3, wherein for each element the direction of magnetization in the quiescent state is parallel to an edge positioned for facing relationship to the associated recording medium.

5. A device as claimed in claim 4, wherein said magnet is adapted to generate at the area of each element an auxiliary field having a field strength which is of the order of magnitude of the coercive field strength of the material of the elements.

6. A device as claimed in claim 1, wherein said magnetoresistive elements are of equal length, are disposed in coplanar aligned relationship with a combined length which corresponds to the width of information tracks present on the associated recording medium to be scanned, said elements being connected to a current source, a voltage being formed between the final contacts of the pair formed by the first and the second element when the pair is not centered on a track to be followed, positioning means being present which are controlled by said voltage so as to keep said pair of elements continuously centered on a track to be followed.

7. A device as claimed in claim 1, wherein said device comprises a substrate having an edge of which is intended to cooperate with a recording medium to be scanned, the first and the second magneto-resistive element being provided on the substrate at different distances from the said edge.

8. A device as claimed in claim 7, wherein the distance to the edge of the substrate of the element farthest remote from the said edge is of the order to magnitude of the distance between two adjacent information tracks on a recording medium to be scanned.

* * * * *